United States Patent [19]
Dresner

[11] Patent Number: 4,600,935
[45] Date of Patent: Jul. 15, 1986

[54] BACK-TO-BACK DIODES

[75] Inventor: Joseph Dresner, Princetown Township, Mercer County, N.J.

[73] Assignee: RCA Corporation, Princeton, N.J.

[21] Appl. No.: 671,315

[22] Filed: Nov. 14, 1984

[51] Int. Cl.⁴ .............. H01L 29/12; H01L 45/00; H01L 27/12; H01L 23/32
[52] U.S. Cl. ............................ 357/58; 357/2; 357/4; 357/76
[58] Field of Search ................... 357/2, 4, 58, 76

[56] References Cited

U.S. PATENT DOCUMENTS

| | | | |
|---|---|---|---|
| 4,064,521 | 12/1977 | Carlson | 357/2 |
| 4,109,271 | 8/1978 | Pankove | 357/30 |
| 4,385,200 | 5/1983 | Hamakawa et al. | 357/2 |
| 4,409,424 | 10/1983 | Devaud | 357/2 |
| 4,410,902 | 10/1983 | Malik | 357/13 |
| 4,531,142 | 7/1985 | Weyrich et al. | 357/56 |

Primary Examiner—Martin H. Edlow
Assistant Examiner—Terri M. Henn
Attorney, Agent, or Firm—Birgit E. Morris; Donald S. Cohen

[57] ABSTRACT

A back-to-back diode includes a substrate having five superimposed layers of hydrogenated amorphous silicon thereon. The first and fifth layers are of one conductivity type, the second and fourth layers are intrinsic, and the third layer is of the opposite conductivity type. The layers are all of the substantially the same thickness. A conductive layer contact is provided between the substrate and the first layer and a conductive layer contact is provided on the fifth layer. The intrinsic layers may include carbon alloyed with the hydrogenated amorphous silicon.

8 Claims, 7 Drawing Figures

BACK-TO-BACK DIODES

The present invention relates to back-to-back diodes and, more particularly, to thin film back-to-back diodes.

BACKGROUND OF THE INVENTION

Although thin film semiconductor devices, i.e. semiconductor devices in which the active portion of the device is a thin film of semiconductor material, have been known for some time, there has recently developed a need for making integrated circuits which include thin film semiconductor devices on an insulating substrate. For example, for display devices, such as liquid crystal displays, it has been found desirable to be able to form the drive circuit for the display device directly on one of the glass plates which form the liquid crystal display device. One type of semiconductor device which is desirable for such an integrated circuit is a back-to-back diode, i.e. two diodes in series but with the polarity of one being reversed to that of the other.

SUMMARY OF THE INVENTION

A back-to-back diode includes a substrate having on a surface thereof a first layer of hydrogenated amorphous silicon of one conductivity type. A second layer of intrinsic hydrogenated amorphous silicon is on the first layer and a third layer of hydrogenated amorphous silicon of the opposite conductivity type is on the second layer. A fourth layer of intrinsic hydrogenated amorphous silicon is on the third layer and a fifth layer of hydrogenated amorphous silicon of the one conductivity type is on the fourth layer. Each of the layers of hydrogenated amorphous silicon is of substantially the same thickness.

DETAILED DESCRIPTION OF PREFERRED EMBODIMENT

Figure 1:
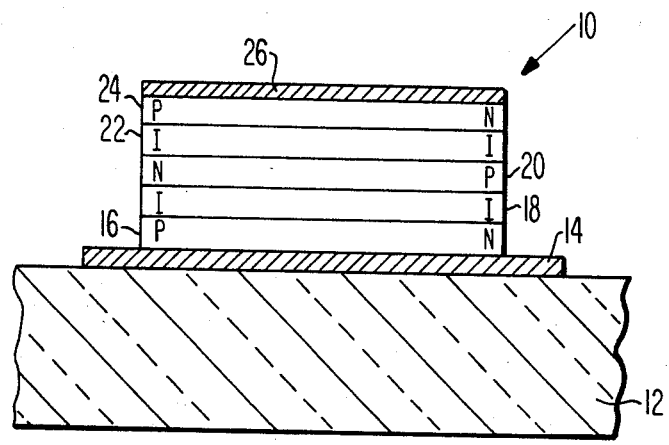
FIG. 1 is a sectional view of a form of the back-to-back diode of the present invention.

Referring initially to FIG. 1, a form of a back-to-back diode of the present invention is generally designated as 10. The back-to-back diode 10 includes a substrate 12 of an insulating material, such as glass having on a surface thereof a thin layer 14 of a conductive material, such as chromium, molybdemum, nickel or tin oxide. The conductive layer 14 serves as one contact for the diode 10.

On the conductive layer 14 is a first layer 16 of hydrogenated amorphous silicon which is of one conductivity type. On the first layer 16 is a second layer 18 of intrinsic amorphous silicon. On the second layer 18 is a third layer 20 of hydrogenated amorphous silicon of the opposite conductivity type. On the third layer 20 is a fourth layer 22 of intrinsic hydrogenated amorphous silicon and on the fourth layer 22 is a fifth layer 24 of hydrogenated amorphous silicon of the same conductivity type as the first layer 16. Thus, if the first and fifth layer 16 and 24 respectively are of P type conductivity, as indicated on the left side of FIG. 1, the third layer 20 is of N type conductivity to form a PINIP back-to-back diode 10. However, if the first and third layer 16 and 24 are of N type conductivity, as indicated at the right side of FIG. 1, the third layer is of P type conductivity to form an NIPIN back-to-back diode 10.

A conductive layer 26 is on the fifth layer 24 to form the other contact of the back-to-back diode 10. The conductive layer 26 may be of aluminum if the diode 10 is not exposed to temperatures greater than 100° C. Otherwise, a diffusion barrier, such as titanium, must be interposed between the aluminum layer and the fifth layer 24 or an inert metal, such as chromium, nickel or molybdenum, should be used as the contact layer 26.

An important characteristic of a diode is its current-voltage characteristic, known as its I-V characteristic. As the voltage applied in the reverse direction across a diode is increased, the current increases exponentially with the voltage. When plotted on a linear scale, the current appears to remain negligibly small until a point called the breakdown voltage is reached, and then the current increases rapidly. A plot of the I-V characteristic is referred to as an I-V curve. In a linear plotted I-V curve the point at which the current increases is referred to as the "knee" of the curve. For a diode, it is desirable that the knee be as sharp as possible. Also, it is often desirable to be able to control the voltage at which the knee will occur. For the back-to-back diode 10 of the present invention, the voltage at which the knee will occur can be controlled by controlling the thickness of the intrinsic layers 18 and 22 according to the following formula:

$$V = 2.64 + 0.0106L$$

where V is the voltage at which the reverse current density equals 0.25 Amp/cm$^2$, and L is the thickness of the intrinsic layers in angstroms.

Thus, for the back-to-back diode 10 of the present invention, the thickness of the intrinsic second and fourth layers 18 and 22 is determined by the above formula. The first, third, and fifth layers 16, 20 and 24 respectively can be of substantially the same thickness as the intrinsic layers 18 and 22. A back-to-back diode 10 of the present invention having the layers of a thickness of about 1,000 angstroms has been found to provide a back-to-back diode 10 having very satisfactory characteristics.

The back-to-back diode 10 can be made by first depositing the conductive layer 14 on the substrate 12. This can be achieved by any of the well-known processes of sputtering, vacuum evaporation, or chemical vapor deposition. The hydrogenated amorphous silicon layers 16, 18, 20, 22 and 24 are then each deposited in succession by the technique of glow discharge in silane. This method as well as apparatus for carrying out the method is disclosed in U.S. Pat. No. 4,064,521, to David E. Carlson, issued Dec. 20, 1977 entitled "Semiconductor Device Having A Body of Amorphous Silicon", which is incorporated herein by reference. To deposit the P type hydrogenated amorphous silicon layers, a gas containing a P type conductivity modifier, such as diborane, is included with the silane. To form an N type hydrogenated amorphous silicon layer, a gas containing N type conductivity modifier, such as phosphine, is included with the silane. An undoped layer of the hydrogenated amorphous silicon will be intrinsic. The conductive layer 26 may also be deposited by either sputtering, vacuum evaporation, or chemical vapor deposition in known manner.

Figure 2:
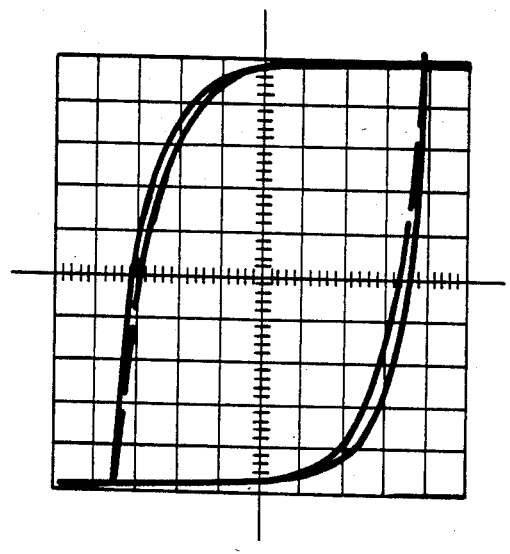
FIGS. 2-7 are graphs showing the electrical characteristics of various forms of the back-to-back diode of the present invention.
Figure 3:
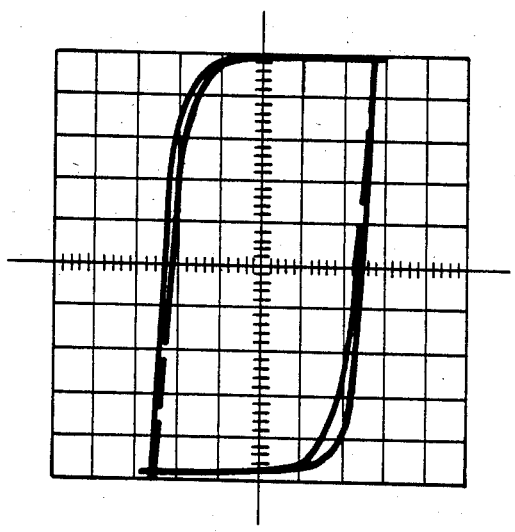

As previously stated, an important characteristic of a diode is the sharpness of the knee of the I-V curve. It is often convenient for engineering purposes to express the form of the I-V curve in the high current range by the equation $I=kV^n$. In this expression the value of the exponent n will indicate the sharpness of the knee. The larger the value of the exponent n, the sharper the knee. FIG. 2 is an I-V curve for an NIPIN back-to-back diode 10 of the present invention. FIG. 3 is an I-V curve of a PINIP back-to-back diode of the present invention in which all of the layers are of the same thickness as the diode having the curve shown in FIG. 2. Thus, the diodes from which the curves of FIGS. 2 and 3 were made were identical except that the conductivity types of the layers were reversed. The exponent n for the diode of FIG. 2 range from 8.5 to 10.5 and the exponent n for the diode of FIG. 3 range from 11.9 to 15.8. The range for the value of the exponent n in each case exists because the I-V curves shown have some hysteresis and the two slopes do not have precisely the same slope. However, it can be seen that the PINIP back-to-back diode 10 has a higher value of the exponent n, and thus a sharper knee than the NIPIN diode. Thus, even though the two diodes were made substantially exactly alike, except for the reversal of the conductivity types of the layers, the PINIP diode has better characteristics than the NIPIN diode.

I have found that certain benefits can be obtained by alloying carbon with the hydrogenated amorphous silicon of the intrinsic layers 18 and 22. This will provide intrinsic layers 18 and 22 of a-Si:C:H instead of a-Si:H. The carbon alloyed layers can be formed by including a hydrocarbon, such as methane ($CH_4$) with the silane during the deposition process. A method for depositing such a carbon alloy layer is described in U.S. Pat. No. 4,109,271, to Jacques I. Pankove, issued Aug. 22, 1978, entitled "Amorphous Silicon-Amorphous Silicon Carbide Photovoltaic Device", which is incorporated herein by reference.

Figure 4:
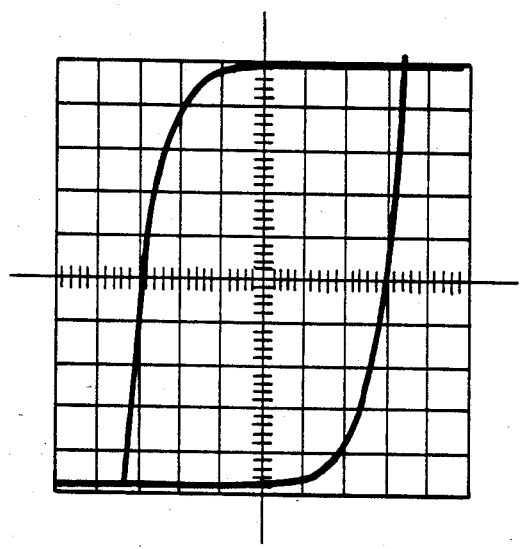

FIG. 4 is an I-V curve for a PINIP back-to-back diode of the present invention in which 20% by volume of methane was mixed with the silane to deposit the intrinsic layers. The deposited intrinsic layers contained about 5 atomic percent carbon. By comparing the curve of FIG. 4 with that of FIG. 3, which is for a PINIP back-to-back diode of the present invention having no carbon in the intrinsic layers, it can be seen that by adding the carbon to the intrinsic layer the hysteresis of the I-V curve has almost completely disappeared.

Figure 5:
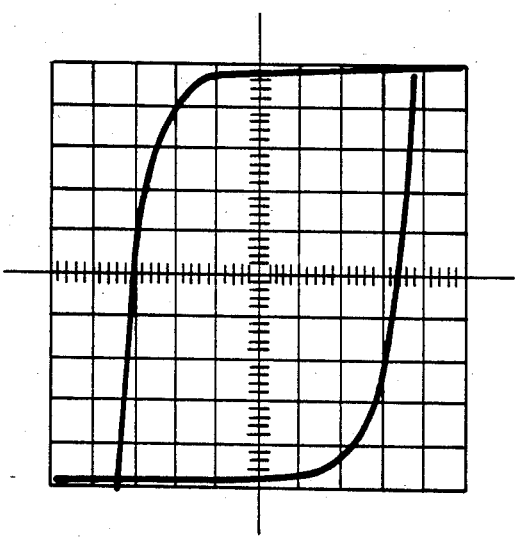

FIG. 5 is an I-V curve for a PINIP back-to-back diode of the present invention in which 30% by volume methane was included with the silane to deposit the intrinsic layers so that the intrinsic layers contained about 11 atomic percent of carbon. By comparing FIG. 5 with FIG. 4 it can be seen that the additional carbon causes the hysteresis to decrease even further. However, the primary effect of alloying with carbon is to increase the band gap of the intrinsic layer. This results in the field needed for a given current density to increase with the carbon concentration. The diode can then burn out due to excessive power dissipation. Thus it has been found that it is desirable not to exceed 20% by volume methane in the silane when depositing the intrinsic layers. For such a diode the thickness of the intrinsic layers is determined by the following formula:

$$V = 2.52 \times 0.016L$$

Figure 6:
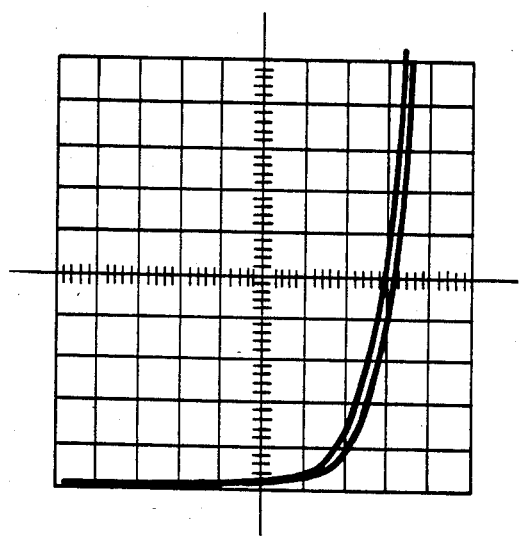
Figure 7:
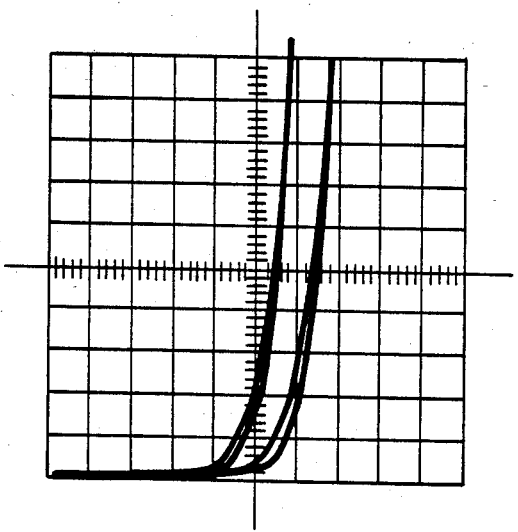

FIGS. 6 and 7 show another effect of including carbon in the intrinsic layers. These graphs show the results where diodes are overstressed thermally by being run continually at high current density at 60 Hz A.C. FIG. 6 is for a back-to-back diode in which carbon is included in the intrinsic layers and shows a small shift in the reverse characteristics after 15 minutes of such stress. FIG. 7 is for a diode which does not include carbon in the intrinsic layers and shows a much larger shift in the reverse characteristic. Thus, the addition of carbon in the intrinsic layer provides a back-to-back diode which is more stable under conditions of thermal overstress.

I claim:

1. A semiconductor back-to-back diode comprising a substrate,
   a first layer of hydrogenated amorphous silicon of one conductivity type on said substrate,
   a second layer of intrinsic hydrogenated amorphous silicon on said first layer,
   a third layer of hydrogenated amorphous silicon of the opposite conductivity type on said second layer,
   a fourth layer of intrinsic hydrogenated amorphous silicon on said third layer, and
   a fifth layer of hydrogenated amorphous silicon of the one conductivity type on said fourth layer, each of said layers being of substantially the same thickness.

2. A back-to-back diode in accordance with claim 1 wherein the first and fifth layers are of P type conductivity and the third layer is of N type conductivity 3. A back-to-back diode in accordance with claim 1 wherein the first and fifth layers are of N type conductivity and the third layer is of P type conductivity.

4. A back-to-back diode in accordance with claim 1 wherein the thickness of each of the intrinsic layers is determined by $$V = 2.64 + 0.0106L$$

where V is the voltage and L is the thickness in angstroms.

5. A back-to-back diode in accordance with claim 1 wherein the intrinsic layers include carbon alloyed with the hydrogenated amorphous silicon.

6. A back-to-back diode in accordance with claim 5 wherein the carbon content is no greater than about 11 atomic percent.

7. A back-to-back diode in accordance with claim 6 wherein the thickness of each of the intrinsic layers is determined by $$V = 2.52 + 0.016L$$

where V is the voltage and L is the thickness in angstroms.

8. A back-to-back diode in accordance with claim 1 including a conductive layer between the substrate and the first layer and a conductive layer on the fifth layer.

* * * * *